US007742553B1

(12) United States Patent
Bataineh et al.

(10) Patent No.: US 7,742,553 B1
(45) Date of Patent: Jun. 22, 2010

(54) VCO INITIAL FREQUENCY CALIBRATION CIRCUIT AND METHOD THEREFORE

(75) Inventors: Khaldoun Bataineh, Austin, TX (US); Michael Mass, Mendota Heights, MN (US); Michael J. Gaboury, Burnsville, MN (US); David E. Tetzlaff, Minnetonka, MN (US)

(73) Assignee: XILINX, Inc., San Jose, CA (US)

( * ) Notice: Subject to any disclaimer, the term of this patent is extended or adjusted under 35 U.S.C. 154(b) by 846 days.

(21) Appl. No.: 11/035,773

(22) Filed: Jan. 14, 2005

(51) Int. Cl.
*H03D 3/24* (2006.01)

(52) U.S. Cl. .................... 375/376; 375/354; 375/373; 375/375; 375/327; 327/147; 327/156; 455/180.3; 455/260; 342/103

(58) Field of Classification Search ............... None
See application file for complete search history.

(56) References Cited

U.S. PATENT DOCUMENTS

| | | | | |
|---|---|---|---|---|
| 5,257,294 A * | 10/1993 | Pinto et al. | ................. | 375/376 |
| 5,521,947 A * | 5/1996 | Madsen | ................. | 375/375 |
| 5,970,106 A * | 10/1999 | Izumikawa | ................. | 375/376 |
| 6,215,835 B1 * | 4/2001 | Kyles | ................. | 375/376 |
| 6,831,491 B2 * | 12/2004 | Karlquist | ................. | 327/156 |
| 6,859,509 B1 * | 2/2005 | Koudelka | ................. | 375/373 |
| 7,542,533 B2 * | 6/2009 | Jasa et al. | ................. | 375/354 |
| 2002/0075080 A1 * | 6/2002 | Nelson et al. | ................. | 331/11 |
| 2003/0042985 A1 * | 3/2003 | Shibahara et al. | ................. | 331/17 |
| 2004/0119514 A1 * | 6/2004 | Karlquist | ................. | 327/158 |
| 2006/0145769 A1 * | 7/2006 | Vaananen et al. | ................. | 331/16 |
| 2007/0009072 A1 * | 1/2007 | Jasa et al. | ................. | 375/354 |

* cited by examiner

*Primary Examiner*—Shuwang Liu
*Assistant Examiner*—Gina McKie
(74) *Attorney, Agent, or Firm*—Timothy W. Markison; Michael T. Wallace; John J. King

(57) ABSTRACT

A device and a method for processing high data rate serial data includes a VCO initial frequency calibration circuit. The circuit includes a frequency detection block for indicating a difference between a reference clock and a divided VCO clock, a frequency calibration block that produces a digital output signal based upon the difference between the reference clock and the divided VCO clock, and a digital-to-analog converter for producing an analog VCO adjust signal. The frequency detection block produces a plurality of signals based upon the reference clock and the divided VCO clock. A plurality of user selected inputs selects a frequency detection lock range and hysteresis range and a coarse loop open calibration lock and hysteresis range. The frequency calibration block implements a state machine for producing the digital output signal that sets the initial operating frequency then adjusts the frequency of the VCO clock.

20 Claims, 12 Drawing Sheets

VCO initial frequency calibration circuit programmable MGT 14 - 28

VCO initial frequency calibration circuit programmable receive PMA module 40 programmable transmit PMA module 38

VCO initial frequency calibration circuit state machine transceiver 172 transceiver 190 clock recovery circuit 200

VCO INITIAL FREQUENCY CALIBRATION CIRCUIT AND METHOD THEREFORE

REFERENCE TO A COMPUTER PROGRAM LISTING APPENDIX

This application includes a computer program-listing appendix on a single compact disc, the contents of which are incorporated herein by reference in its entirety. The compact disc contains a 57 KB file entitled "Freq_cal_circuit.txt" created Dec. 20, 2004. A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Technical Field of the Invention

This invention relates generally to communication systems and more particularly to clock recovery circuits used therein.

2. Description of Related Art

Communication systems are known to transport large amounts of data between a plurality of end user devices which, for example, includes telephones, facsimile machines, computers, television sets, cellular telephones, personal digital assistants, etc. As is known, such communication systems may be local area networks (LANs) and/or wide area networks (WANs) that are stand-alone communication systems or interconnected to other LANs and/or WANs as part of a public switched telephone network (PSTN), a packet switched data network (PSDN), an integrated service digital network (ISDN), or Internet. As is further known, communication systems include a plurality of system equipment to facilitate the transporting of data. Such system equipment includes, but is not limited to, routers, switches, bridges, gateways, protocol converters, frame relays, and private branch exchanges.

The transportation of data within communication systems is governed by one or more standards that ensure the integrity of data conveyances and fairness of access for data conveyances. For example, there are a variety of Ethernet standards that govern serial transmissions within a communication system at data rates of 10 megabits per second, 100 megabits per second, 1 gigabit per second and beyond. Synchronous Optical NETwork (SONET), for example, currently provides for up to 10 gigabits per second. In accordance with such standards, many system components and end user devices of a communication system transport data via serial transmission paths. Internally, however, the system components and end user devices may process data in a parallel manner. As such, each system component and end user device must receive the serial data and convert the serial data into parallel data without loss of information.

Accurate recovery of information from high-speed serial transmissions typically requires transceiver components that operate at clock speeds equal to or higher than the received serial data rate. Higher clock speeds limit the usefulness of prior art clock recovery circuits that require precise alignment of signals to recover clock and/or data. Higher data rates require greater bandwidth for the feedback loop of the clock recovery circuits to operate correctly. Some prior art designs are bandwidth limited.

As the demand for data throughput increases, so do the demands on a high-speed serial transceiver. The increased throughput demands are pushing some current integrated circuit manufacturing processes to their operating limits, where integrated circuit processing limits (e.g., device parasitics, trace sizes, propagation delays, device sizes) and integrated circuit (IC) fabrication limits (e.g., IC layout, frequency response of the packaging, frequency response of bonding wires) limit the speed at which the high-speed serial transceiver may operate without excessive jitter performance and/or noise performance.

A further alternative for high-speed serial transceivers is to use an IC technology that inherently provides for greater speeds. For instance, switching from a CMOS process to a silicon germanium or gallium arsenide process would allow integrated circuit transceivers to operate at greater speeds, but at substantially increased manufacturing costs. CMOS is more cost effective and provides easier system integration. Currently, for most commercial-grade applications, including communication systems, such alternate integrated circuit fabrication processes are too cost prohibitive for widespread use.

Modern communication systems, including high data rate communication systems, typically include a plurality of circuit boards that communicate with each other by way of signal traces, bundled data lines, back planes, etc. Accordingly, designers of high data rate communication transceiver devices often have conflicting design goals that relate to the performance of the particular device. For example, there are many different communication protocols specified for data rates that range from 2.48832 gigabits per second for OC48, to 9.95 gigabits per second for OC192. Other known standards define data rates of 2.5 gigabits per second (INFINIBAND) or 3.125 gigabits per second (XAUI). These different data rates affect the allowable rise and fall time of the signal, the peak amplitude of the signal and the response time from an idle state. For example, one protocol may specify a peak voltage range of 200-400 millivolts, while another standard specifies a mutually exclusive voltage range of 500-700 millivolts. Thus, a designer either cannot satisfy these mutually exclusive requirements (and therefore cannot support multiple protocols) or must design a high data rate transceiver device that can adapt according to the protocol being used for the communications.

Along these lines, field programmable gate array (FPGA) circuits are gaining in popularity for providing the required flexibility and adaptable performance described above for those designers that seek to build one device that can operate according to multiple protocols. Thus, while FPGA technology affords a designer an opportunity to develop flexible and configurable hardware circuits, specific designs that achieve the desired operations must still be developed.

To meet the design goals for multiple protocols, it is desirable to have an FPGA voltage controlled oscillator (VCO) design that can operate over a wide range. Typically, the VCO is operable in a phase locked loop (PLL) to maintain the oscillator at the desired frequency. One problem with the PLL is that it takes time for the PLL to settle at the desired frequency. This settle time may violate a protocol guard time requirement especially for high data rate serial data transceivers. A need exists, therefore, for a device and accompanying method for quickly initializing and calibrating a wideband VCO to a desired frequency.

BRIEF SUMMARY OF THE INVENTION

The present invention provides for a device and a method for processing high data rate serial data by providing a programmable frequency initialization and calibration circuit for phase locked loops (PLLs). Generally, the embodiments invention include circuitry operable to detect a difference between a reference clock and a divided VCO clock and for calibrating the VCO clock frequency by adjusting a VCO digital-to-analog converter (DAC) to set an initial operational state prior to operation by the PLL. The embodiments of the present invention provide a plurality of user selectable pre-calibration and post-calibration signals that define the VCO lock range and hysteresis range. Applications for the present invention are many but specifically include multi-gigabit transceivers, switching devices and protocol translation devices.

One embodiment of the present invention includes a transceiver for processing high data rate serial data including clock data recovery (CDR) circuitry for receiving high data rate serial data and recovering a clock from the high data rate serial data, the CDR circuitry further including a VCO initial frequency calibration circuit and a phase locked loop (PLL).

The VCO initial frequency calibration circuit of the described embodiments set an initial frequency of operation for the PLL of the CDR based upon a selected data rate. The VCO initial frequency calibration circuit includes a frequency detection block for generating an indication of a difference between the reference clock and the divided VCO clock, a frequency calibration block that produces a digital output signal having a magnitude based upon the indication of the difference between the reference clock and the divided VCO clock, and the DAC for converting the digital output signal to an analog VCO adjust signal.

The frequency detection block produces a lock signal, a VCO high signal, and a lock update signal based upon the reference clock and the divided VCO clock, and a plurality of user selected inputs. The plurality of user selected inputs includes at least one pre-calibration signal and at least one post-calibration signal, wherein the at least one pre-calibration signal selects a frequency detection lock range and hysteresis range and wherein the at least one post-calibration signal selects a coarse loop calibration lock and hysteresis range.

The frequency calibration block implements a state machine for producing the digital output signal that sets the initial operating frequency of the divided VCO clock. The state machine adjusts the digital output signal based upon a resulting indication of the difference between the reference clock and the divided VCO clock produced by the frequency detection block. The state machine performs a coarse frequency adjustment then a fine frequency adjustment while the phase locked loop is opened from the VCO. After receiving a lock indication from the frequency detection block, the state machine then verifies that the fine frequency adjustment is producing a digital output value that places the initial VCO clock frequency into a desired range by verifying three consecutive lock indications. Once frequency calibration is verified, the state machine closes the phase locked loop and opens the VCO initial frequency calibration circuit to enable the phase locked loop to further adjust the divided VCO clock frequency to recover at least one of a clock signal and a data signal.

The methods of the embodiments of the present invention include receiving high data rate serial data and setting an initial frequency of operation, wherein the initial frequency of operation is based upon a selected data rate. Setting an initial frequency of operation includes generating an indication of a difference between a reference clock and a divided VCO clock, producing a digital output signal having a magnitude based upon the indication of the difference between the reference clock and the divided VCO clock, and converting the digital output signal to an analog VCO adjust signal.

DETAILED DESCRIPTION OF THE INVENTION

Figure 1:
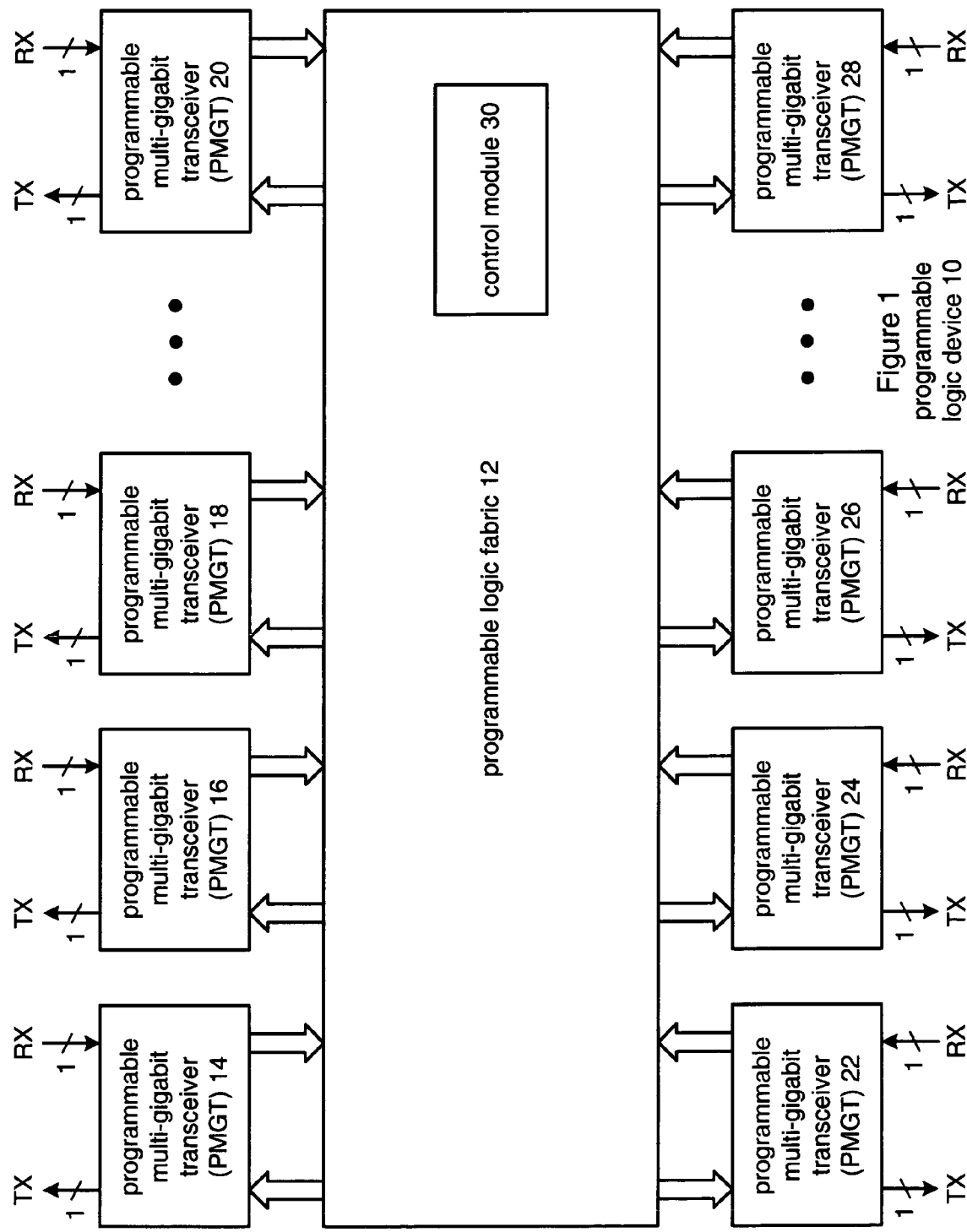
FIG. 1 is a schematic block diagram of a programmable logic device that includes programmable logic fabric, a plurality of programmable multi-gigabit transceivers (PMGT) and a control module.

FIG. 1 is a schematic block diagram of a programmable logic device 10 that includes programmable logic fabric 12, a plurality of programmable multi-gigabit transceivers (PMGT) 14-28 and a control module 30. The programmable logic device 10 may be a programmable logic array device, a programmable array logic device, an erasable programmable logic device, and/or a field programmable gate array (FPGA). When the programmable logic device 10 is an FPGA, the programmable logic fabric 12 may be implemented as a symmetric array configuration, a row-based configuration, a sea-of-gates configuration, and/or a hierarchical programmable logic device configuration. The programmable logic fabric 12 may further include at least one dedicated fixed processor, such as a microprocessor core, to further facilitate the programmable flexibility offered by a programmable logic device 10.

The control module 30 may be contained within the programmable logic fabric 12 or it may be a separate module. In either implementation, the control module 30 generates the control signals to program each of the transmit and receive sections of the programmable multi-gigabit transceivers 14-28. In general, each of the programmable multi-gigabit transceivers 14-28 performs a serial-to-parallel conversion on receive data and performs a parallel-to-serial conversion on transmit data. The parallel data may be, for instance, 8-bits, 16-bits, 32-bits, or 64-bits wide.

Typically, the serial data will be a 1-bit stream of data that may be a binary level signal, multi-level signal, etc. Further, two or more programmable multi-gigabit transceivers may be bonded together to provide greater transmitting speeds. For example, if programmable multi-gigabit transceivers 14, 16 and 18 are transceiving data at 3.125 gigabits per second, the transceivers 14-18 may be bonded together such that the effective serial rate is approximately 3 times 3.125 gigabits per second. Additionally, the apparatus and method of the present invention allows a wideband VCO within a PLL to be initialized and calibrated to any frequency within the range of the VCO by a VCO initial frequency calibration circuit.

Each of the programmable multi-gigabit transceivers 14-28 may be individually programmed to conform to separate standards. In addition, the transmit path and receive path of each multi-gigabit transceiver 14-28 may be separately programmed such that the transmit path of a transceiver is supporting one standard while the receive path of the same transceiver is supporting a different standard. Further, the serial rates of the transmit path and receive path may be programmed, for example, from 1 gigabit per second to higher serial rates. The size of the parallel data in the transmit and receive sections, or paths, is also programmable and may vary, for instance, from 8-bits, 16-bits, 32-bits, or 64-bits.

Figure 2:
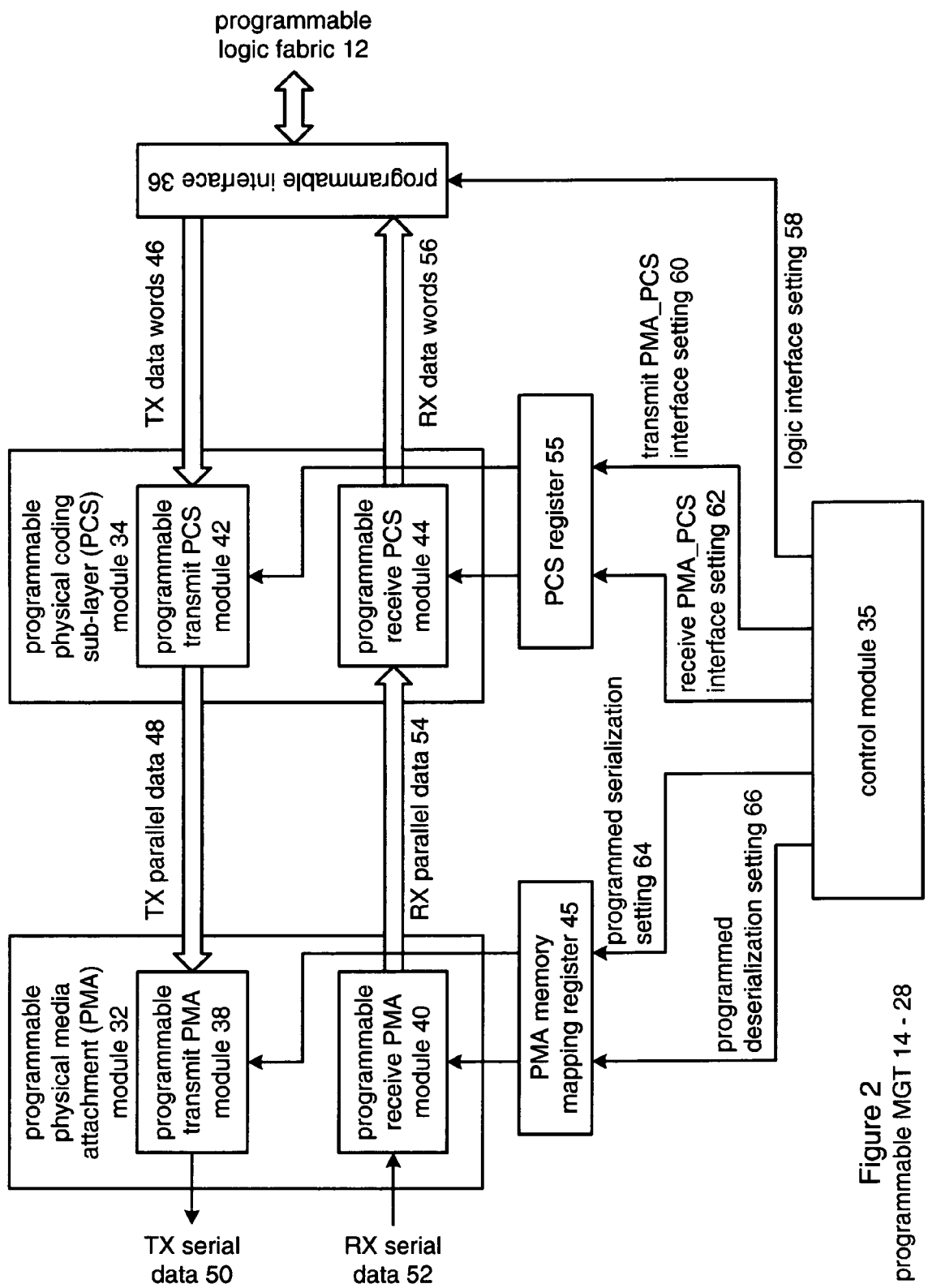
FIG. 2 is a schematic block diagram of one embodiment of a representative one of the programmable multi-gigabit transceivers.

FIG. 2 is a schematic block diagram of one embodiment of a representative one of the programmable multi-gigabit transceivers 14-28. As shown, the programmable multi-gigabit transceiver includes a programmable physical media attachment (PMA) module 32, a programmable physical coding sub-layer (PCS) module 34, a programmable interface 36, a control module 35, a PMA memory mapping register 45 and a PCS register 55. The control module 35, based on the desired mode of operation for the individual programmable multi-gigabit transceiver 14-28, generates a programmed deserialization setting 66, a programmed serialization setting 64, a receive PMA_PCS interface setting 62, a transmit PMA_PCS interface setting 60, and a logic interface setting 58. The control module 35 may be a separate device within each of the multi-gigabit transceivers or included partially or entirely within the control module 30 of FIG. 1.

In either embodiment of the control module 35, the control module 30 determines the corresponding overall desired operating conditions for the programmable logic device 10 and provides the corresponding operating parameters for a given programmable multi-gigabit transceiver to its control module 35, which generates the settings 58-66.

The programmable physical media attachment (PMA) module 32 includes a programmable transmit PMA module 38 and a programmable receive PMA module 40. The programmable transmit PMA module 38, which will be described in greater detail with reference to FIG. 6B, is operably coupled to convert transmit parallel data 48 into transmit serial data 50 in accordance with the programmed serialization setting 64. The programmed serialization setting 64 indicates the desired rate of the transmit serial data 50, the desired rate of the transmit parallel data 48, and the data width of the transmit parallel data 48. The programmable receive PMA module 40 is operably coupled to convert receive serial data 52 into receive parallel data 54 based on the programmed deserialization setting 66. The programmed deserialization setting 66 indicates the rate of the receive serial data 52, the desired rate of the receive parallel data 54, and the data width of the receive parallel data 54. The PMA memory mapping register 45 may store the programmed serialization setting 64 and the programmed deserialization setting 66.

The programmable physical coding sub-layer (PCS) module 34 includes a programmable transmit PCS module 42 and a programmable receive PCS module 44. The programmable transmit PCS module 42 receives transmit data words 46 from the programmable logic fabric 12 via the programmable interface 36 and converts them into the transmit parallel data 48 in accordance with the transmit PMA_PCS interface setting 60. The transmit PMA_PCS interface setting 60 indicates the rate of the transmit data words 46, the size of the transmit data words (e.g., 1-byte, 2-bytes, 3-bytes, 4-bytes) and the corresponding transmission rate of transmit parallel data 48. The programmable receive PCS module 44 converts receive parallel data 54 into receive data words 56 in accordance with the receive PMA_PCS interface setting 62. The receive PMA_PCS interface setting 62 indicates the rate at which receive parallel data 54 will be received, the width of receive parallel data 54, the transmit rate of the receive data words 56 and the word size of the receive data words 56.

The control module 35 also generates the logic interface setting 58 that provides the rates at which the transmit data words 46 and receive data words 56 will be transceived with the programmable logic fabric 12. Note that the transmit data words 46 may be received from the programmable logic fabric 12 at a different rate than what the receive data words 56 are provided to the programmable logic fabric 12.

As one of average skill in the art will appreciate, each of the modules within the programmable PMA module 32 and programmable PCS module 34 may be individually programmed to support a desired data transfer rate. The data transfer rate may be in accordance with a particular standard such that the receive path, i.e., the path through programmable receive PMA module 40 and the programmable receive PCS module 44, may be programmed in accordance with one standard, while the transmit path, i.e., the path through the programmable transmit PCS module 42 and the programmable transmit PMA module 38, may be programmed in accordance with the same or another standard.

Figure 3:
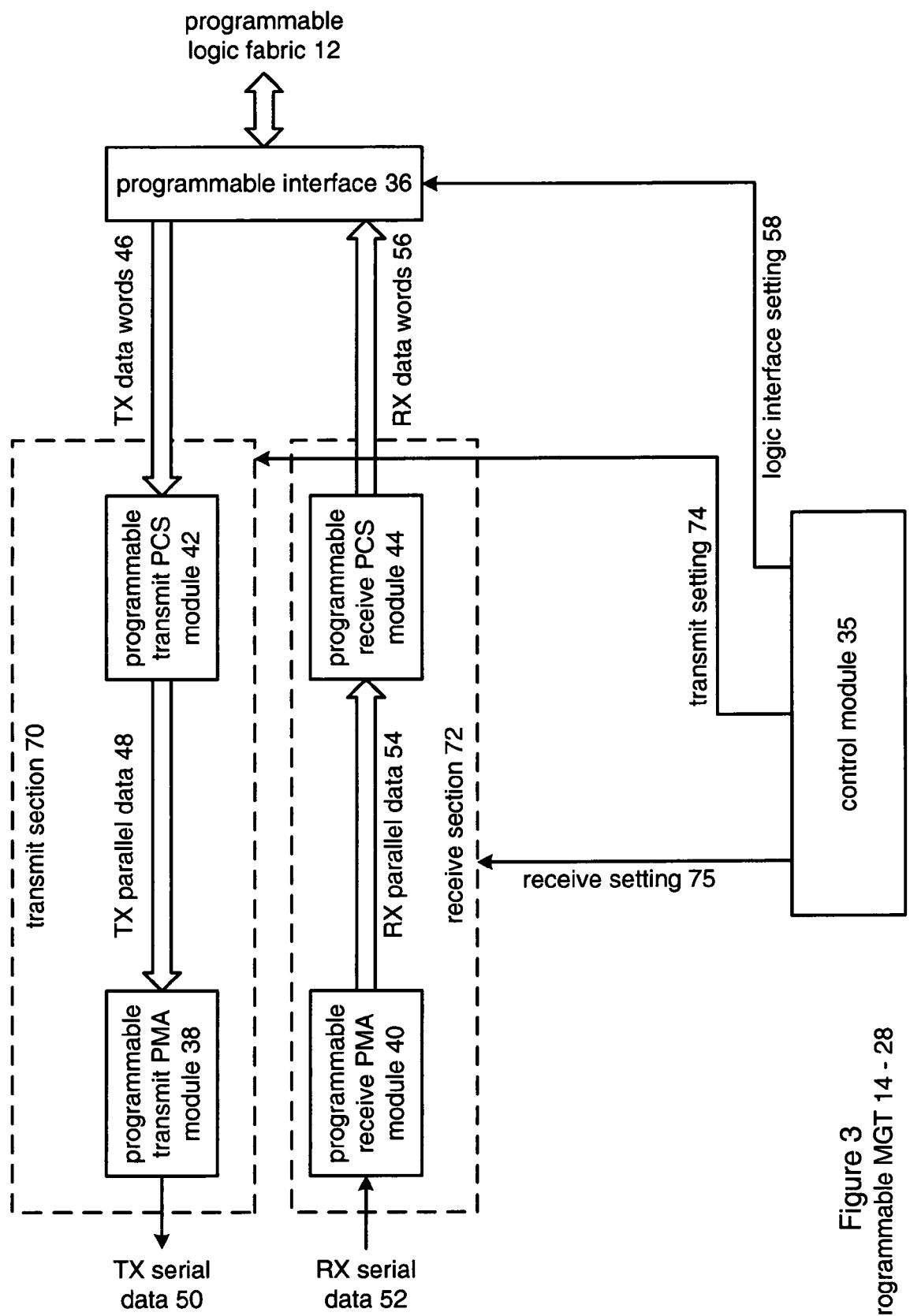
FIG. 3 illustrates an alternate schematic block diagram of a representative one of the programmable multi-gigabit transceivers.

FIG. 3 illustrates an alternate schematic block diagram of a representative one of the programmable multi-gigabit transceivers 14-28. In this embodiment, the programmable multi-gigabit transceiver 14-28 includes a transmit section 70, a receive section 72, the control module 35 and the programmable interface 36. The transmit section 70 includes the programmable transmit PMA module 38 and the programmable transmit PCS module 42. The receive section 72 includes the programmable receive PMA module 40 and the programmable receive PCS module 44.

In this embodiment, the control module 35 separately programs the transmit section 70 and the receive section 72 via transmit setting 74 and receive setting 75, respectively. The control module 35 also programs the programmable interface 36 via the logic interface setting 58. Accordingly, the control module 35 may program the receive section 72 to function in accordance with one standard while programming the transmit section 70 in accordance with the same or another standard. Further, the logic interface setting 58 may indicate that the transmit data words 46 are received from the programmable logic fabric 12 at a different rate than the received data words 56 are provided to the programmable logic fabric 12. As one of average skill in the art will appreciate, the programmable interface 36 may include a transmit buffer and a receive buffer, and/or an elastic store buffer to facilitate the providing and receiving of the data words 46 and 56 to and from the programmable logic fabric 12.

Figure 4:
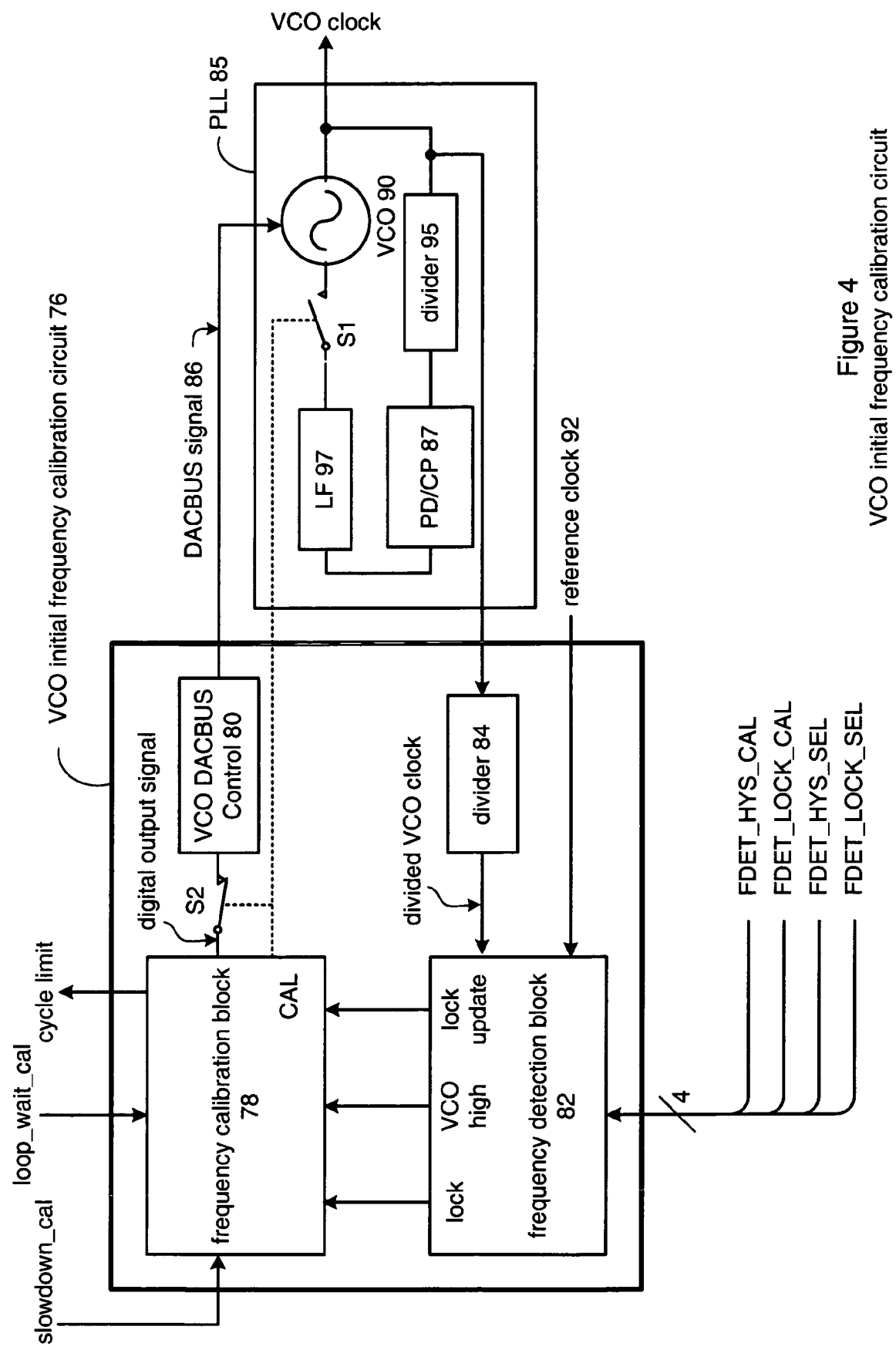
FIG. 4 illustrates a schematic block diagram of a VCO initial frequency calibration circuit in accordance with one embodiment of the present invention.

FIG. 4 illustrates a schematic block diagram of a VCO initial frequency calibration circuit in accordance with one embodiment of the present invention. VCO initial frequency calibration circuit 76 includes a frequency calibration block 78, a VCO digital-to-analog control(DAC) 80, a frequency detection block 82, a loop filter (LF) 97, a divider 84, and a switch S2. VCO initial frequency calibration circuit 76 is operably coupled to receive a slowdown_cal signal, a loop_wait_cal signal, a reference clock 92, a VCO clock and a plurality of calibration and post-calibration signals. The calibration signals comprise FDET_HYS_CAL and FDET_LOCK_CAL, while the post-calibration signals include FDET_HYS_SEL and FDET_LOCK_SEL. A Verilog hardware description language implementation of this VCO initial frequency calibration circuit 76 is given in the Computer Appendix CD, which is herein incorporated by reference.

After a VCO reset or a power on reset, frequency calibration block 78 sets the CAL signal that closes switch S2 and opens switch S1 of an external phase-locked loop 85 comprising phase detector/charge pump (PD/CP) 87, LF 97, VCO 90, and a divider 95 Switch S1 in the external oscillation circuit is opened so that the frequency adjustment circuitry within PLL 85 does not interfere with the 10-bit DACBUS signal 86 produced by VCO initial frequency calibration circuit 76. VCO DACBUS control 80 sets DACBUS signal 86 to an initial programmable value by the user, typically to a value lower than the desired final VCO clock frequency. The 10-bit DACBUS signal 86 is a DAC bus value that is operably coupled to a digital-to-analog converter (DAC) internal to VCO 90. The DAC bus value controls a VCO 90 current source such that, as the DAC bus value increases, the current into the VCO increases and its frequency output increases. When the DAC Bus value decreases, the current into the VCO decreases and its output frequency decreases. The VCO clock produced by VCO 90 is operably coupled to divider 84 that divides the serial VCO clock by an integer such that the divided VCO clock is substantially equal to parallel reference clock 92 based on the serial to parallel ratio.

Frequency detection block 82 receives the divided VCO clock and reference clock 92 into a plurality of ripple counters (not shown) that counts the number of cycles of each clock. Frequency detection block 82 produces a lock, a VCO high, and a lock update based, in part, on a resulting indication of a difference between the reference clock 92 and the divided VCO clock. The lock, the VCO high, and the VCO lock update are operably coupled to frequency calibration block 78 that calibrates the frequency of the VCO clock such that the difference between the reference clock and the divided VCO clock is less than a user selected value. Frequency calibration block 78 produces a digital output signal to VCO DACBUS control 80 that produces DACBUS signal 86 that is operably coupled to VCO 90 where it is converted from a digital domain to an analog domain.

User selectable calibration signals FDET_LOCK_CAL and FDET_HYS_CAL determine frequency detection block 82 lock range and lock hysteresis, respectively. As shown in Table 1, FDET_LOCK_CAL is a three-bit signal that sets the comparison between the divided VCO clock and reference clock 92. If FDET_LOCK_CAL is set to binary 011, frequency detection block 82 will count 2048 low to high transitions of the divided VCO clock then check the output of the reference clock counter. If the reference clock counter is within 2044 to 2051 then the divided VCO clock is within the lock range and frequency detection block 82 sets the lock signal high.

TABLE 1

Frequency lock range.

| FDET_LOCK_CAL | Compare | Lock lower | Lock upper |
|---|---|---|---|
| 000 | 16384 | 16380 | 16387 |
| 001 | 8192 | 8188 | 8195 |
| 010 | 4096 | 4092 | 4099 |
| 011 | 2048 | 2044 | 2051 |
| 100 | 1024 | 1020 | 1027 |
| 101 | 512 | 508 | 515 |
| 110 | 256 | 252 | 259 |
| 111 | 128 | 124 | 131 |

Once in the lock range, FDET_HYS_CAL determines the loss of lock range for frequency detection block 82. For example, if FDET_HYS_CAL is set to binary 101, the lock hysteresis is +/−128 counts (−128 to +127), as shown in Table 2. The lock signal will remain high as long as the comparison between the divided VCO clock and reference clock 92 for FDET_LOCK_CAL set to 011 is 2048+/−128 or within 1920 to 2175. If the comparison falls outside this range, frequency detection block 82 forces the lock signal low.

TABLE 2

Hysteresis lock range.

| FDET_HYS_CAL | HYS lower limit | HYS upper limit |
|---|---|---|
| 000 | Compare −4 | Compare +3 |
| 001 | Compare −8 | Compare +7 |
| 010 | Compare −16 | Compare +15 |
| 011 | Compare −32 | Compare +31 |
| 100 | Compare −64 | Compare +63 |
| 101 | Compare −128 | Compare +127 |
| 110 | Compare −256 | Compare +255 |
| 111 | Compare −512 | Compare +511 |

If the comparison between the divided VCO clock and reference clock 92 indicates the divided VCO clock frequency is higher, frequency detection block 82 sets the VCO high signal to logic 1 or high but sets it low otherwise. The lock update signal is set high for one clock cycle by frequency detection block 82 at the end of every comparison cycle to indicate the lock and VCO high signals have been updated. Frequency calibration block 78 waits for the lock update signal to go high before evaluating the lock and VCO high signals.

Since the VCO clock frequency will not change instantaneously with a change in the digital output signal, frequency calibration block 78 initiates a user programmable wait period to allow VCO 90 to reach a steady state. The loop_wait_cal signal operably coupled to frequency calibration block 78 is a two-bit signal that tells the frequency calibration block 78 how long to wait before reentering the calibration cycle once frequency calibration is done, where 00 starts at $2^{14}$. Additionally, the slowdown_cal signal, also user programmable, tells the frequency calibration block 78 how many times to implement the lock cycle during the frequency calibration period. Table 3 indicates the ranges of the loop_wait_cal signal and the slowdown_cal signal.

TABLE 3

Delay times Control Selection.

| Loop wait cal | Wait time | Slow down cal | Wait time |
|---|---|---|---|
| 00 | $2^{14}$ * ref clock | 00 | 2 * lock update cycles |
| 01 | $2^{16}$ * ref clock | 01 | 3 * lock update cycles |
| 10 | $2^{18}$ * ref clock | 10 | 4 * lock update cycles |
| 11 | $2^{20}$ * ref clock | 11 | 5 * lock update cycles |

Once the wait periods have expired, frequency calibration block 78 looks at the lock signal, the VCO high signal, and the lock update signal from frequency detection block 82 to determine if the VCO clock frequency is within a desired user selectable range period as defined by user selectable FDET_LOCK_CAL and FDET_HYS_CAL. FDET_LOCK_SEL and FDET_HYS_SEL operate after the frequency calibration is done and are identical to the previously described FDET_LOCK_CAL and FDET_HYS_CAL signals. The operation of the lock signal, the VCO high signal, and the lock update signal as it relates to frequency calibration will be described in more detail with respect to FIG. 6.

Once the frequency calibration is complete, frequency calibration block 78 clears the CAL signal, thus opening switch S2 and closing S1. The last digital output signal is held by DACBUS signal 86 which maintains VCO 90 at the calibrated frequency. With the loop circuitry completed by the closure of switch S1, PLL 85 receives the calibrated VCO clock signal in order to recover one of a clock signal and data signal from an incoming high-speed serial data stream (not shown).

Figure 5A:
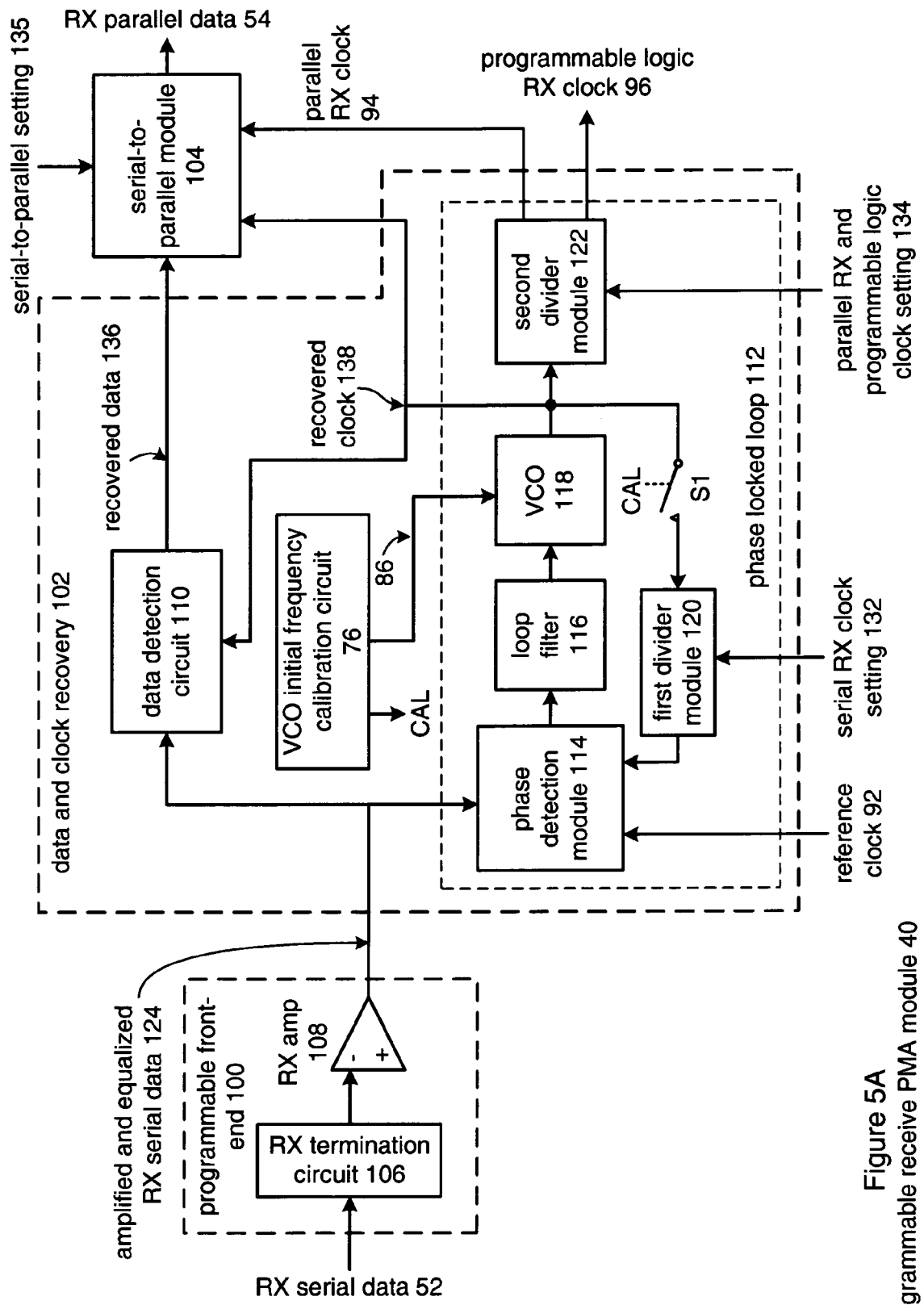
FIG. 5A illustrates a schematic block diagram of a programmable receive PMA module that includes a programmable front-end, a data and clock recovery module, and a serial-to-parallel module in accordance with one embodiment of the present invention.

FIG. 5A illustrates a schematic block diagram of the programmable receive PMA module 40 that includes a programmable front-end 100, a data and clock recovery module 102, and a serial-to-parallel module 104. The programmable front-end 100 includes a receiver termination circuit 106 and a receiver amplifier 108. The data and clock recovery module 102 includes a data detection circuit 110, VCO initial frequency calibration circuit 76, and a phase locked loop 112. The phase locked loop 112 includes a phase detection module 114, a loop filter 116, a VCO 118, a CAL switch S1, a first divider module 120, and a second divider module 122.

The programmable front-end 100 is operably coupled to receive the receive serial data 52 and produce amplified and equalized receive serial data 124 therefrom. To achieve this, the receiver termination circuit 106 is programmed to provide the appropriate termination for the transmission line between the programmable receive PMA module 40 and the source that originally transmitted the receive serial data 52. The receive termination setting 126 may indicate whether receive serial data 52 is a single-ended signal, a differential signal, may indicate the impedance of the transmission line, and may indicate the biasing of the receiver termination circuit 106.

The receiver termination circuit 106 further biases receive serial data 52 and provides the bias adjusted signal to the receiver amplifier 108. The equalization and gain settings of the receiver amplifier 108 may be adjusted to produce amplified and equalized RX serial data 124.

The data and clock recovery module 102 receives the amplified and equalized receive serial data 124 via the data detection circuit 110, and phase locked loop 112 receives it via the phase detection module 114. VCO 118 of phase locked loop 112 is calibrated by VCO initial frequency calibration circuit 76 after a hard reset or a power-up reset. The CAL signal from VCO initial frequency calibration circuit 76 opens switch S1, placing phase locked loop 112 in an open loop condition, so that phase detection module 114 will not be able to adjust VCO 118. After initial VCO calibration, phase detection module 114 is initialized prior to receiving the amplified and equalized receive serial data 124 by comparing the phase and/or frequency of reference clock 92 with a feedback reference clock produced by first divider module 120. Based on this phase and/or frequency difference, the phase detection module 114 produces a corresponding current that is provided to loop filter 116. The loop filter 116 converts the current into a control voltage that adjusts the output frequency of VCO 118. The first divider module 120, based on a serial receive clock setting 132, divides the output oscillation produced by VCO 118 to produce the feedback signal. Once the amplified and equalized receive serial data 124 is received, the phase detection module 114 compares the phase of the amplified and equalized receive serial data 124 with the phase of the feedback signal, and produces a current signal based on the phase difference.

The phase detection module 114 provides the current signal to the loop filter 116, which converts it into a control voltage that controls the output frequency of VCO 118. At this point, the output of VCO 118 corresponds to a recovered clock 138 in steady state operation. The recovered clock 138 is provided to the second divider module 122, the data detection circuit 110 and to the serial-to-parallel module 104. The data detection circuit 110 utilizes the recovered clock 138 to recover recovered data 136 from the amplified and equalized receive serial data 124. The second divider module 122 divides the recovered clock 138, in accordance with a parallel receive and programmable logic clock setting 134, to produce the parallel receive clock 94 and a programmable logic receive clock 96. Note that the serial receive clock setting 132 and the parallel receive and programmable logic clock setting 134 are part of the programmed deserialization setting 66 provided to the programmable receive PMA module 40 by the control module 35 shown in FIG. 2.

The serial-to-parallel module 104, which may include an elastic store buffer, receives the recovered data 136 at a serial rate in accordance with the recovered clock 138. Based on a serial-to-parallel setting 135 and the parallel receive clock 94, the serial-to-parallel module 104 outputs receive parallel data 54. The serial-to-parallel setting 135, which may be part of the programmed deserialization setting 66, indicates the data rate and data width of receive parallel data 54.

Figure 5B:
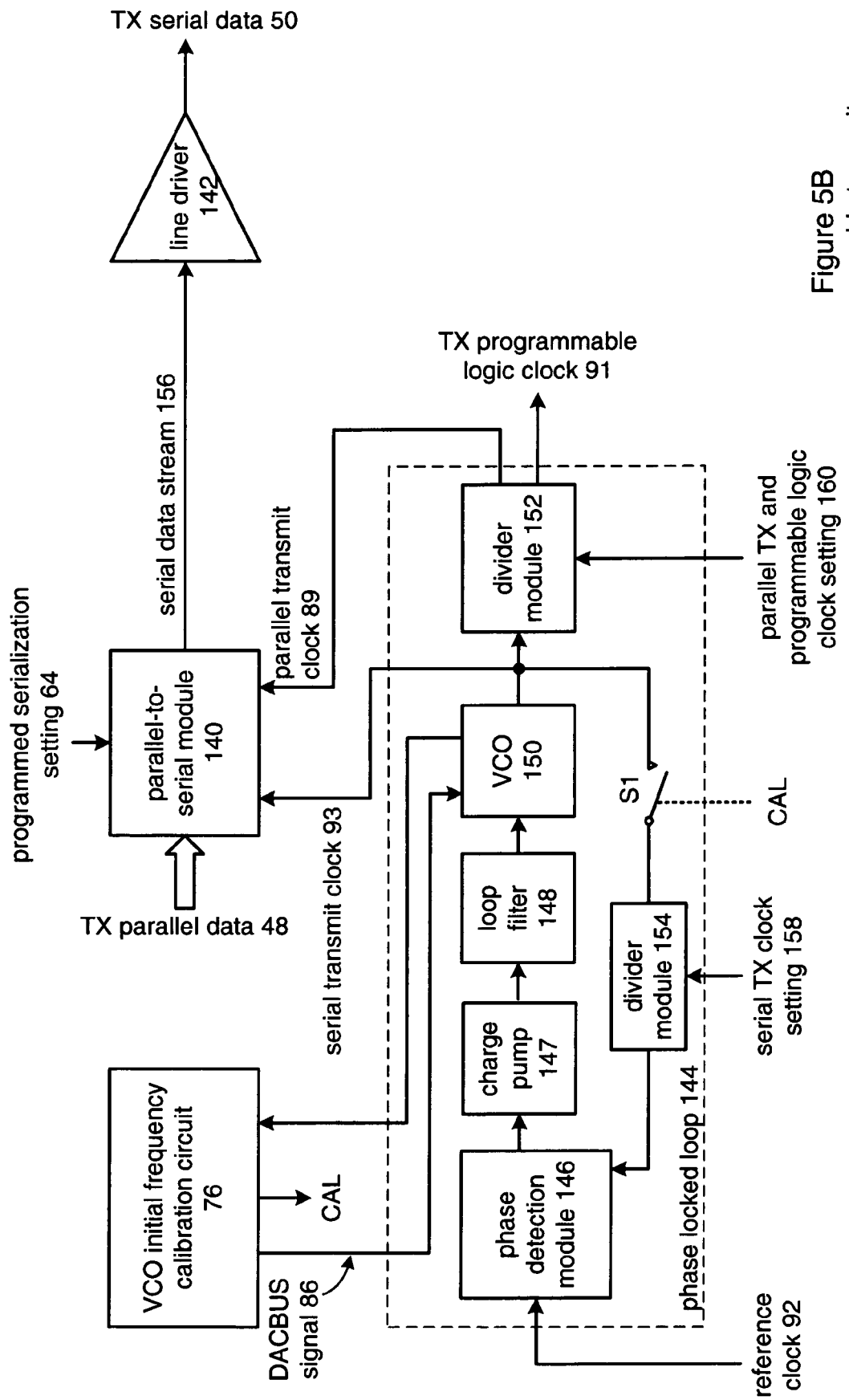
FIG. 5B illustrates a schematic block diagram of a programmable transmit PMA module in accordance with one embodiment of the present invention.

FIG. 5B illustrates a schematic block diagram of a programmable transmit PMA module 38. The module includes a phase locked loop 144, a parallel-to-serial module 140, and a line driver 142. The phase locked loop 144 includes a phase detection module 146, a charge pump 147, a loop filter 148, a voltage controlled oscillator 150, a CAL switch S1, a divider module 154, and a divider module 152.

The phase detection module 146 compares the phase and/or frequency of the reference clock 92 with the phase and/or frequency of an output produced by divider module 154. The phase detection module 146 generates control signals to charge pump 147 which, in turn, produces a current signal to represent the phase and/or frequency difference between the reference clock 92 and the feedback oscillation. The loop filter 148 converts the current signal into a control voltage that regulates the output oscillation produced by VCO 150. VCO 150 also receives DACBUS signal 86 from VCO initial frequency calibration circuit 76 to adjust the VCO frequency to the center of a desired operating range. Operation of VCO initial frequency calibration circuit 76 was discussed with respect to FIGS. 4 and 5A. Divider module 154, based on a serial transmit clock setting 158, divides the output oscillation of VCO 150, which corresponds to the serial transmit clock 92, to produce the feedback oscillation. Note that the serial transmit clock setting 158 may be part of the programmed serialization setting 64 provided to the programmable transmit PMA module 38 by the control module 35.

Divider module 152 receives the serial transmit clock 93 and, based on a parallel transmit and programmable logic clock setting 160, produces a parallel transmit clock 89 and transmit programmable logic clock 91. The parallel transmit and programmable logic clock setting 160 may be part of the programmed serialization setting 64 shown in FIG. 2.

The parallel-to-serial module 140 receives transmit parallel data 48 and produces therefrom a serial data stream 156. To facilitate the parallel-to-serial conversion, the parallel-to-serial module 140, which may include an elastic store buffer, receives a parallel-to-serial setting to indicate the width of the transmit parallel data 48 and the rate of the transmit parallel data, which corresponds to the parallel transmit clock 89. Based on the parallel-to-serial setting, the serial transmit clock 93, and the parallel transmit clock 89, the parallel-to-serial module 140 produces the serial data stream 156 from transmit parallel data 48. The line driver 142 increases the power of the signals forming serial data stream 156 to produce transmit serial data 50. As one of average skill in the art will appreciate, while the diagram of FIG. 6B is shown as a single-ended system, the entire system may use differential signaling and/or a combination of differential and single-ended signaling.

Figure 6:
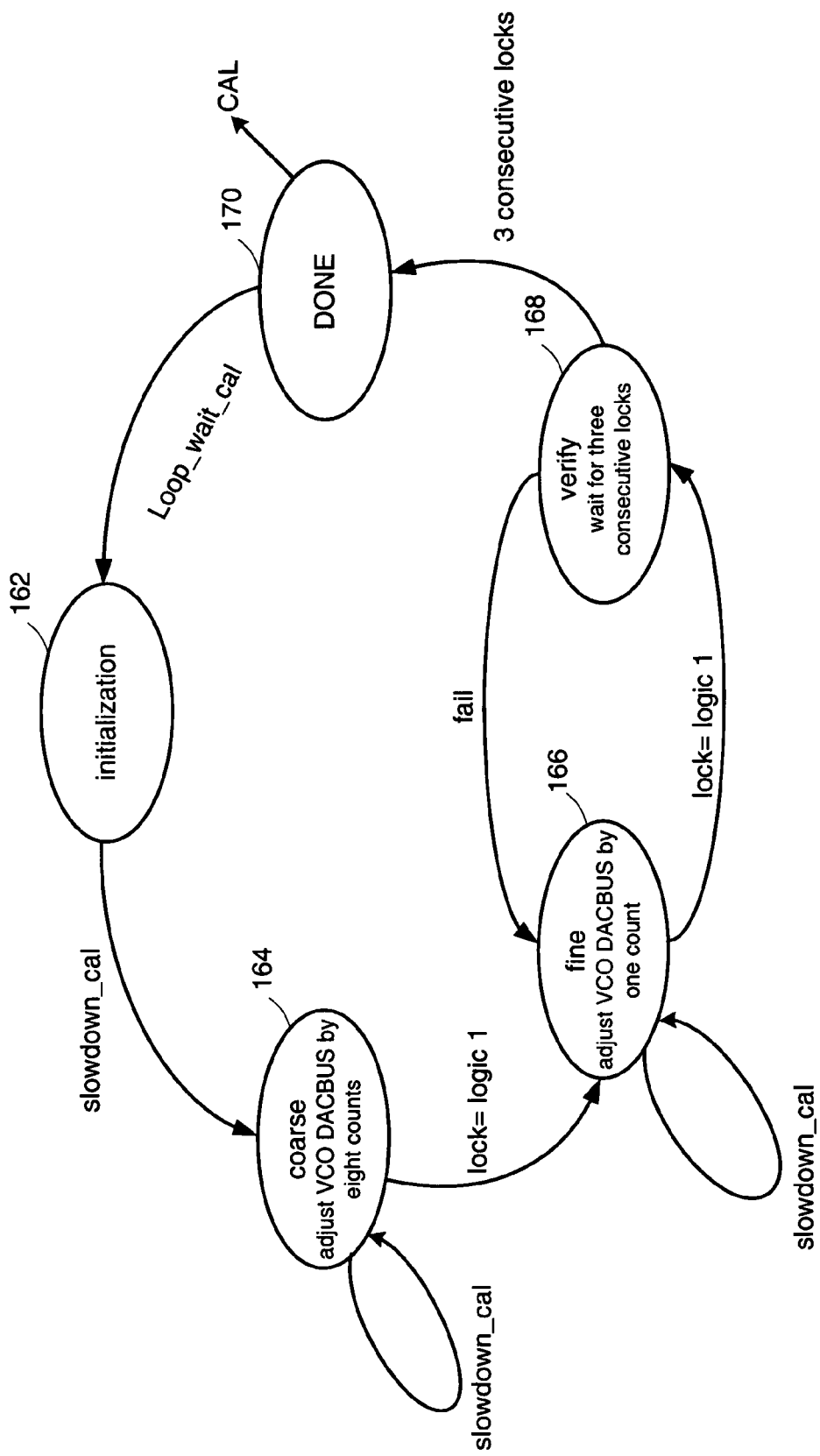
FIG. 6 illustrates a VCO initial frequency calibration circuit state machine in accordance with one embodiment of the present invention.

FIG. 6 illustrates a VCO initial frequency calibration circuit state machine in accordance with one embodiment of the present invention. The state machine starts in the initialization stage 162 as a result of a power-up reset or a hard reset received from the programmable fabric. After a sufficient slowdown_cal time, the state machine moves to a coarse frequency adjust state 164 wherein the state machine adjusts the digital output to the VCO DACBUS by 8 counts, then executes a wait period based on the slowdown_cal signal to allow the VCO clock to reach a steady state. After the expiration of the slowdown_cal period, the state machine waits for the lock update signal to go high indicating that the lock signal and VCO high signal have been updated.

Upon the detection of a positive transition of the lock update signal, the state machine evaluates the lock signal and the VCO high signal. If the lock signal is high, the divided VCO clock and the reference clock are within a selectable frequency error of a lock range period as defined by the user selectable FDET_LOCK_CAL and FDET_HYS_CAL. If, however, the lock signal is low, the state machine adjusts the VCO clock frequency based upon the VCO high signal. If the VCO high signal is logic 1 or high, the divided VCO clock frequency is higher than the reference clock frequency. Thus, the VCO clock frequency must be reduced. The state machine reduces the digital output signal to the VCO DACBUS by 8 counts then enters the slowdown_cal to allow the VCO to reach a steady state in the described embodiment of the invention. This process continues wherein the coarse state of the state machine adjusts the digital output signal to the VCO DACBUS up or down by 8 counts until the divided clock signal and the reference clock signals are within the programmable frequency error, at which time the lock signal will be set to a logic 1 or high. It is understood, of course, that step sizes different from the 8 count step size in the described embodiment may be used as well.

At this point, when the lock signal is set to a logic 1 or high, the state machine moves to the fine loop state 166 wherein the state machine adjusts the digital output signal to the VCO DACBUS by 1 count (in contrast to the less granular step size of 8 counts described above). The operation of the fine state 166 of the state machine is similar to the coarse state 164 wherein the fine state increments or decrements the digital output signal by 1 count until the lock signal goes high. Once the lock signal is detected in fine state 166, the state machine moves to a verify state 168 wherein the digital output signal to the VCO DACBUS is maintained at its present state. The state machine verifies that the lock signal remains high for three consecutive lock update cycles in the verify state 168.

If the lock signal fails to remain high for three consecutive lock update signals, verification fails and the state machine transitions back to the fine state 166. If, however, three consecutive locks are received, the VCO clock frequency is within a selected programmable frequency error and the calibration is complete, at which time the state machine moves to the DONE state 170 and the CAL signal produced from the DONE state is cleared.

Based upon the CAL signal being cleared (reset), logic of the state machine is operable to open switch S2 and close switch S1 of FIG. 4. At this point, the VCO clock frequency is within a user selectable frequency error of the reference clock signal and the voltage controlled oscillation circuit can now accurately recover one of a clock and/or a data from an incoming high-speed serial data stream.

Although not shown in the state machine diagram, two mechanisms, Over_range and Cycle_limit, are added to make sure the state machine will give back control to the PLL in the described embodiment of the invention. Over_range is set for over the limit DACBUS values if the DACBUS wants to move beyond lower and upper limits (hex 000 and hex 3ff for 10-bit mode or hex 00 and hex ff for 8-bit mode). Cycle_limit is the number of times the divided VCO clock frequency crosses the reference clock frequency and is compared to a programmed value between 16 and 1024. Once the number is exceeded, the state machine stops and returns control to the PLL. Both mechanisms provide a means to return control of the VCO to the PLL in the event that the state machine fails to lock to the desired frequency.

Figure 7:
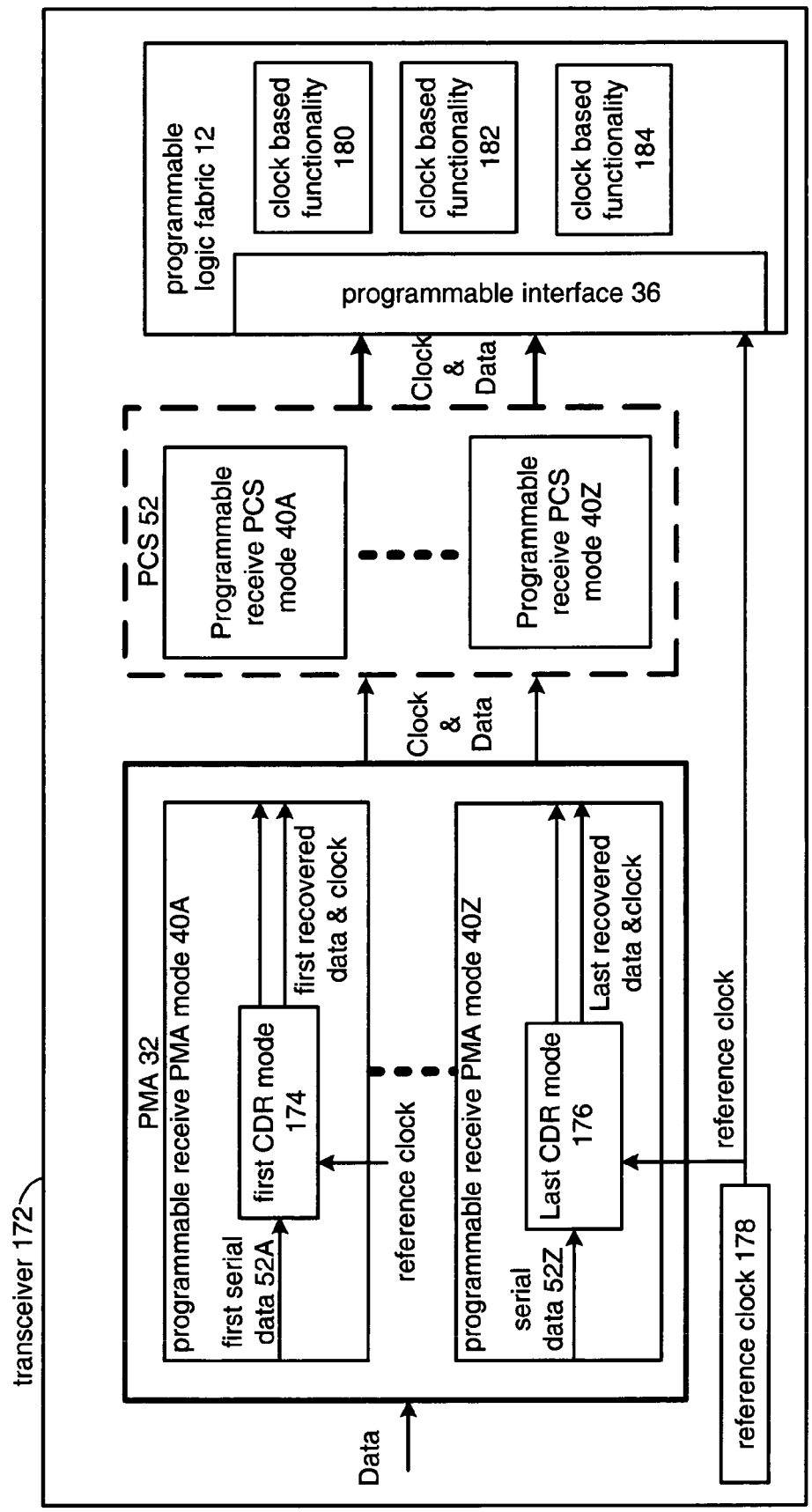
FIG. 7 is a functional block diagram of a transceiver that selects one of a plurality of clocks according to one embodiment of the invention.

FIG. 7 is a functional block diagram of a transceiver that selects one of a plurality of clocks according to one embodiment of the invention. The transceiver 172 of FIG. 7 may be formed as an ASIC, an FPGA, a processor-based device, or any combination thereof for performing a specified function. In the examples of FIG. 7, the transceiver 172 comprises a combination of ASIC and FPGA (e.g., fixed and programmable) circuitry. In FIG. 7, transceiver 172, which is for processing high data rate serial data, includes first clock data recovery circuitry 174 within the PMA 32 running in mode 40A for receiving first serial data 52A, and for providing a first recovered clock and data from the first serial data 52A. The transceiver further includes multiple different modes for clock and data recovery circuitry that can be enabled or disabled one at a time using programmability options provided, the last mode shown is clock data recovery 176 within the PMA 32 running in mode 40Z for receiving the last serial data 52Z, and for providing the last recovered clock from the last serial data 52Z. The transceiver of FIG. 7 further includes a reference clock module 178 for providing a reference clock signal. The reference to "Z" is intended to convey a plurality (2 or more) of data streams or circuit blocks.

The reference clock, the first, other recovered clocks and the last recovered data and clocks are all provided directly to programmable interface 36 of programmable logic fabric 12 or through an optional PCS 52 module with equivalent modes. Programmable logic fabric 12 receives each recovered clock and reference clock produced to it and routes the clock to specified functionalities within the logic fabric as specified by the programmable logic. Additionally, each parallel data stream, here first parallel data 52A up to the last parallel data 52Z, are also provided to programmable interface 36 of programmable logic fabric 12.

The programmable logic fabric 12 includes a plurality of clock based functionalities illustrated herein as clock based functionalities 180, 182 and 184. Each of the first up to the last recovered clocks and the reference clock is provided to a circuit portion of the transceiver wherein the circuit portion chooses among the first and second recovered clocks and the reference clock for subsequent processing by at least one clock based functionality (here, by the three clock based functionalities 180, 182 and 184). For example, in the embodiment of the invention shown in FIG. 7, the first up to the last recovered clocks and the reference clock are provided to the programmable interface 36 of the programmable logic fabric 12 where the high-speed serial data is slowed down by increasing the data width before operably coupling the clocks to the programmable logic fabric 12. Each clock based functionality selects one of the clocks provided to the programmable interface 36 (e.g., one of the first up to the last recovered clocks and the reference clock) and, based on the selected clock, performs subsequent specified functions.

In the described embodiment of FIG. 7, transceiver 172 includes at least three clock based functionalities 180, 182 and 184. Each functionality 180, 182 and 184 selects a clock for its functionality and thus may operate according to different clocks in relation to each other. In the described embodiment, each functionality 180, 182 and 184 selects a specified recovered clock according to programming or internal logic. While each clock based functionality 180, 182 and 184 is shown within programmable logic fabric 12, they may readily be formed external to programmable logic fabric 12 and may, for example, be formed out of and as a part of application specific integrated circuitry or other logic circuitry. Each functionality 180, 182 and 184 includes circuitry for performing a specified task, which may include tasks relating to high rate parallel data processing.

More generally, the transceiver 172 shown in FIG. 7 illustrates the generation of a plurality of clocks and selectively performing specified functions based on any one or more of the plurality of clocks. The apparatus and method of the present invention produces the reference clock and recovered clocks operating that may be initialized and calibrated to any frequency within the range of the wide band oscillator internal to reference clock 178, first CDR 174, up to the last CDR 176. One of average skill in the art will appreciate the advantages of the present invention. Transceiver 172 performs functions that are synchronized in time with the data for which the function is being performed. By separating functionality from a system clock or reference clock, and by synchronizing the functionality with a clock within a serial data transmission, a need for large buffers and the possibility of buffer overflows/underflows due to mismatches in the reference clock and the data stream rate is avoided or at least reduced.

Figure 8:
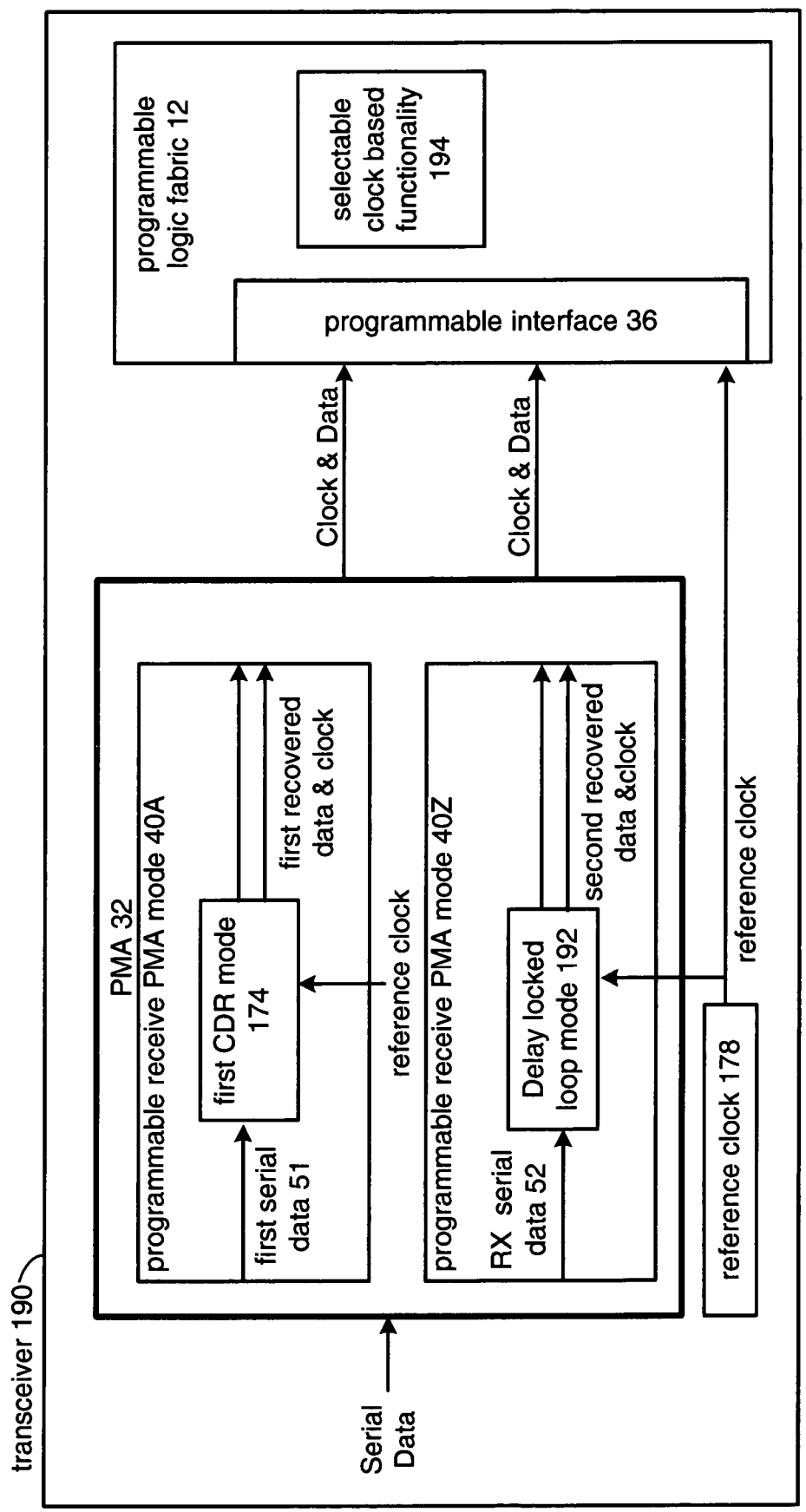
FIG. 8 is a functional block diagram of a transceiver that selects one of a plurality of clocks according to one embodiment of the invention wherein one of the plurality of clocks is a recovered clock for an I/O serial data stream in accordance with one embodiment of the present invention.

FIG. 8 is a functional block diagram of a transceiver 190 that selects one of a plurality of clocks produced by the method of the present invention wherein one of the plurality of clocks is a recovered clock for an first serial data 51. Generally, first serial data 51 represents any serial data stream including a received serial data stream, or an outgoing serial data stream being generated at a specified rate. Transceiver 190 includes a selectable clock based functionality 194 within programmable logic fabric 12 that selects from (i) a first recovered clock provided by a first clock and data recovery circuit 174 that recovers a clock from first serial data 51 or (ii) a second recovered clock provided by a delay locked loop circuit 192 that recovers a clock from an RX serial data 52 and that compensates for downstream phase shifts. While in some applications merely using a reference clock for outgoing transmissions is adequate, in other applications it may be desirable to further synchronize a data operation with a recovered clock for the corresponding outgoing serial data. FIG. 8 also shows that delay locked loop (DLL) circuits may be used in place of CDR circuits for particular applications.

Generally, FIG. 8 illustrates one embodiment of the invention in which an FPGA based transceiver includes a plurality of clock recovery circuits and modes (first CDR 174 and delay locked loop 192) that each must be able to quickly synchronized to the clock of a high data rate serial data stream. As such, each of the clock recovery circuits comprises the inventive circuitry that is operable to quickly set a range of operation for a PLL to allow the PLL to settle in a minimum amount of time.

Figure 9:
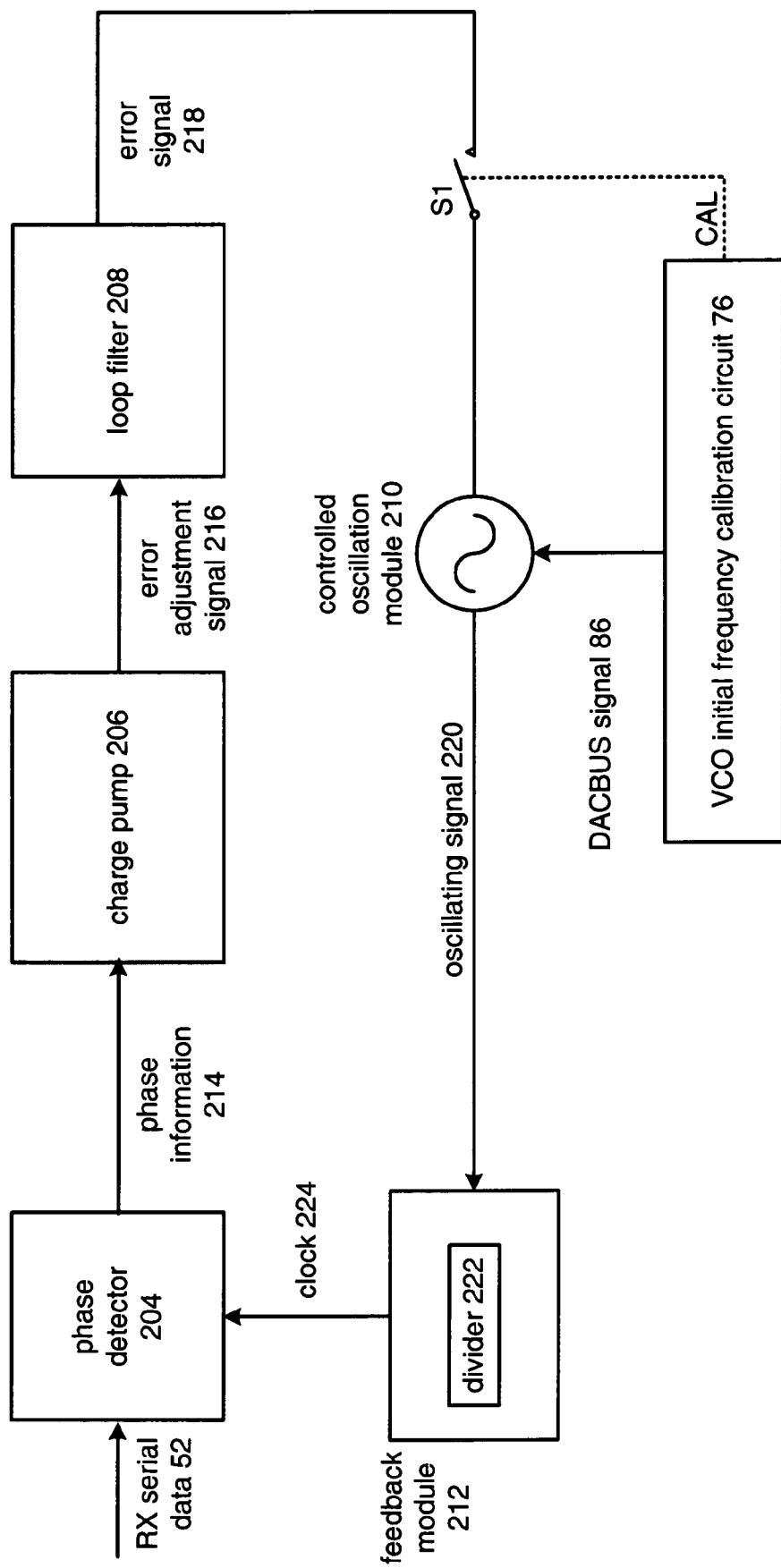
FIG. 9 illustrates a block diagram of a clock and/or data recovery circuit in accordance with one embodiment of the present invention.

FIG. 9 illustrates a block diagram of a clock and/or data recovery circuit 200 in accordance with one embodiment of the present invention. The clock recovery circuit 200 includes a phase detector 204, a charge pump 206, a loop filter 208, a controlled oscillation module 210, a calibration switch S1, and a feedback module 212.

During power-up reset, VCO initial frequency calibration circuit 76 opens calibration switch S1 by setting a CAL signal thereby opening the phase locked loop of clock recovery circuit 202. DACBUS signal 86, operably coupled to controlled oscillation module 210, sets an oscillating signal 220 substantially to the center of a desired range. As was discussed with respect to FIG. 4 and FIG. 6, VCO initial frequency calibration circuit 76 adjusts DACBUS signal 86 until oscillating signal 220 is within a user programmable frequency range, at which point the CAL signal will be reset thereby closing calibration switch S1, allowing clock recovery circuit 202 to recover a clock from receive serial data 52.

Clock recovery circuit 200 receives serial data 52, which may be a high data rate bit stream transferring data at 10 or more gigabits per second. Phase detector 204 produces phase information 214 and error adjustment signal 216 based on the input receive serial data 52 and a feedback clock signal 224 (recovered clock). Operation of phase detector 204 is generally known by one of average skill in the art. Phase detector 204 produces phase information 214 to a charge pump, such as charge pump 206. Charge pump 206 produces error adjustment signal 216 based on the phase information 214. Loop filter 208 then produces an error signal 218 (a voltage signal) to controlled oscillation module 210.

The controlled oscillation module 210 receives the error signal 218 and produces therefrom oscillating signal 220. Feedback module 212 and a divider 222 generate the feedback signal, which is the recovered clock signal 224, by dividing oscillating signal 220 by a divider value (may be "1", i.e., no division), and by converting the resulting oscillation to a digital signal to represent the recovered clock signal 224.

Figure 10:
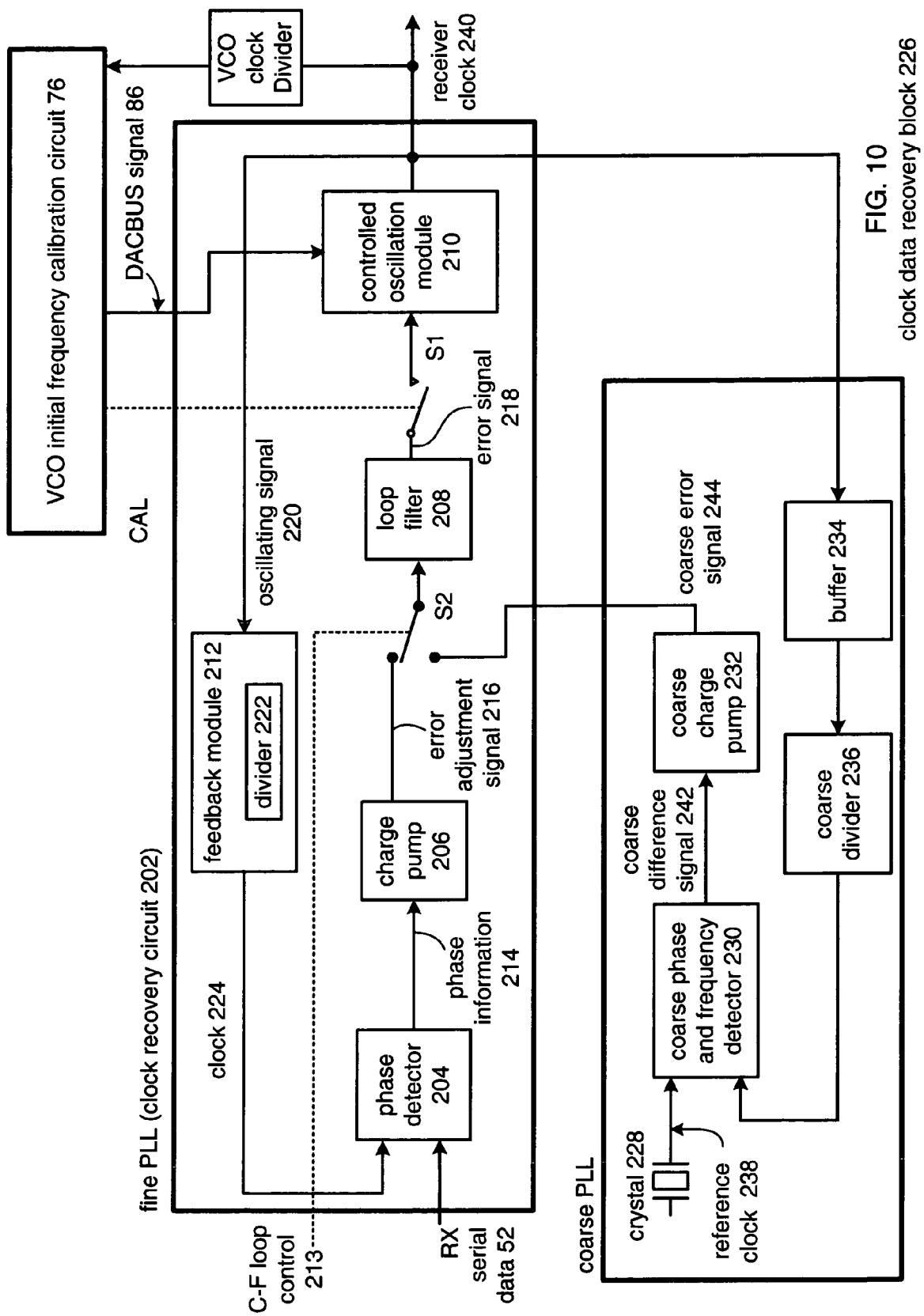
FIG. 10 illustrates a schematic block diagram of a receiver clock data recovery block of a transceiver according to one embodiment of the present invention.

FIG. 10 illustrates a schematic block diagram of a receiver clock data recovery block 226 of a transceiver according to one embodiment of the present invention. The clock data recovery block 226 includes a coarse PLL and a fine PLL. The coarse and fine PLL operation described here in relation to FIG. 10 is different from the coarse and fine adjustments described in FIG. 6 for the VCO initial frequency calibration circuit state machine. In FIG. 6, the coarse and fine calibration relate to the initial frequency calibration prior to frequency adjustment and locking that is performed by the PLL as is described here in FIG. 10.

In general, the coarse PLL establishes the desired frequency for the clocking circuit and the fine PLL adjusts the phase of the clock and will also adjust a limited frequency offset to align it with the incoming data. Switching between the fine PLL and coarse PLL is accomplished by externally produced C-F loop control 213 that controls switch S2. During coarse frequency control, C-F loop control 213 couples coarse error signal 244 to loop filter 208. Once receiver clock 240 is sufficiently close to the desired clocking frequency, switch S2 couples error adjustment signal 216 to loop filter 208.

The feedback signal frequency provided by feedback module 212 is typically one-half the frequency of the receive serial data 52. The coarse PLL includes a crystal oscillator 228 (including, if necessary, a clock multiplier), a coarse phase and frequency detector 230, a coarse charge pump 232, a buffer 234, and a coarse divider 236. The fine PLL comprising clock recovery circuit 202 was described with reference to FIG. 9. The operation of VCO initial frequency calibration circuit 76 was discussed with reference to FIGS. 4 and 5.

To establish the operating frequency for the clocking circuit, crystal oscillator 228 produces a reference clock 238 that is provided to the coarse phase and frequency detector 230. The coarse phase and frequency detector 230 determines the phase and frequency difference between the reference clock 238 and a divided representation of a receiver clock 240. The coarse divider 236 provides the divided representation of the receiver clock 240 to the coarse phase and frequency detector 230 as a feedback signal. Based on the phase and frequency relationship of these signals, coarse phase and frequency detector 230 produces a coarse difference signal 242. Coarse charge pump 232 receives the coarse difference signal 242 and produces a current representation (which is converted to voltage through the trans-impedance included at the output of the fine PLL charge pump 206 thereof) and provides a coarse error signal 244 to controlled oscillation module 210 of the fine loop filter 208 via switch S2. Controlled oscillation module 210 receives the coarse error signal 244, and adjusts the oscillation frequency/phase of receiver clock 240. Once the coarse PLL has established the operating frequency, C-F loop control 213 activates the fine PLL by coupling error adjustment signal 216 to loop filter 208 via switch S2 to adjust the phase of the receiver clock.

Controlled oscillation module 210 may utilize inductor-capacitor oscillators or ring oscillators to produce an output oscillation. If an inductor-capacitor oscillator is utilized, noise levels of controlled oscillation module 210 may be reduced.

As illustrated, clock data recovery block 226 includes two phase locked loops. One is a fine phase locked loop based on receive serial data 52 and the other is a coarse phase locked loop based on reference clock 238. Such a sequential phased locked loop system enables the receiver section to readily capture the inbound serial data 52. As one of average skill in the art will appreciate, clock data recovery block 226 may use single-ended signals or differential signals.

Figure 11:
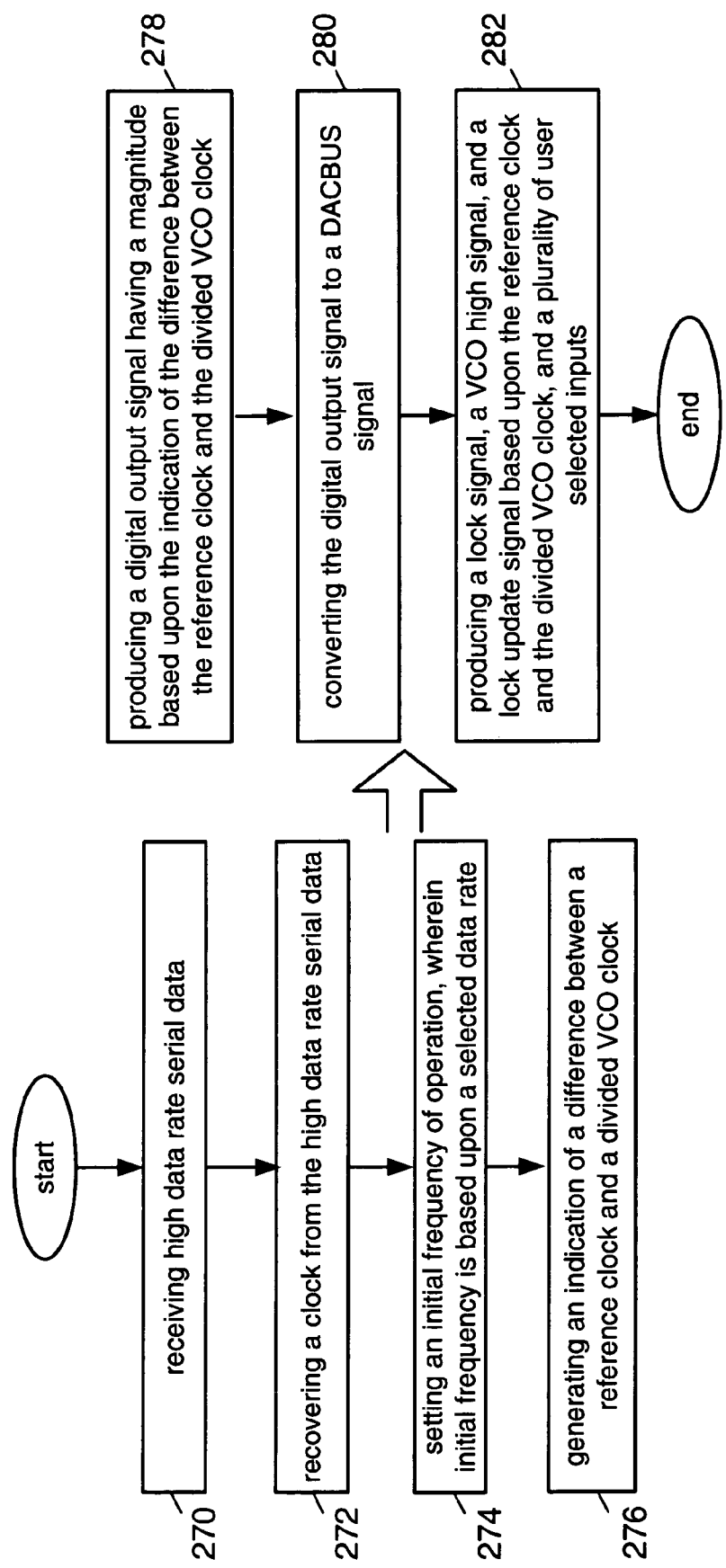
FIG. 11 illustrates a method for initial frequency calibration and detection in accordance with the present invention.

FIG. 11 illustrates a method for initial frequency calibration and detection in accordance with the present invention. Initially, the method according to the described embodiment of the invention includes receiving high data rate serial data (step 270) and recovering a clock from the high data rate serial data (step 272). Thereafter, the method includes setting an initial frequency of operation, wherein the initial frequency is based upon a selected data rate (step 274). As previously mentioned, the present invention allows a wide band local oscillator to be initialized anywhere within the VCO range. The VCO calibration circuit adjusts the VCO clock to within a user selectable lock range.

The inventive method thereafter includes generating an indication of a difference between a reference clock and a divided VCO clock (step 276). The divided VCO clock is produced by dividing the VCO clock by an integer so that the divided VCO clock is substantially equal to the reference clock that is typically provided by the programmable fabric. The inventive method includes producing a digital output signal having a magnitude based upon the indication of the difference between the reference clock and the divided VCO clock (step 278).

Thereafter, the inventive method further produces the digital output signal to a VCO DACBUS control for converting the digital output signal to a DACBUS signal (step 280). The DACBUS signal is produced to the VCO to adjust the VCO clock frequency. Since the VCO cannot change instantaneously, a user selectable wait period is initiated. Following the expiration of the wait period, the method includes producing a lock signal, a VCO high signal, and a lock update signal based upon the reference clock and the divided VCO clock, and a plurality of user selected inputs (step 282). Although not shown, it should be clear to one of average skill in the art that the flow chart of FIG. 11 may loop iteratively from step 282 to step 276 until the desired final results are achieved.

The invention disclosed herein is adaptable to various modifications and alternative forms. Therefore, specific embodiments have been shown by way of example in the drawings and detailed description. It should be understood, however, that the drawings and detailed description thereto are not intended to limit the invention to the particular form disclosed, but on the contrary, the invention is to cover all modifications, equivalents, and alternatives falling within the spirit and scope of the present invention as defined by the claims.

The Appended materials includes Verilog Code of one embodiment of the invention, which Verilog Code may readily be understood by one of average skill in the art.

What is claimed is:

1. A transceiver for processing high data rate serial data, comprising:

clock data recovery (CDR) circuitry for receiving the high data rate serial data and recovering a clock from the high data rate serial data, the CDR circuitry further including a phase locked loop (PLL) that initially operates at an initial voltage controlled oscillator (VCO) clock frequency and subsequently operates at a frequency based upon a clock rate of the high data rate serial data;

a VCO initial frequency calibration circuit for setting the initial VCO clock frequency for the PLL of the CDR circuitry, wherein the VCO initial frequency calibration circuit sets the initial VCO clock frequency within a programmable phase locked loop lock range of the clock rate of the high data rate serial data based upon a frequency of a reference clock, and wherein the VCO initial frequency calibration circuit further comprises:

a frequency detection block for an indication of a difference between the reference clock and a divided VCO clock;

a frequency calibration block that produces a digital output signal having a magnitude based upon the indication of the difference between the reference clock and the divided VCO clock;

a digital-to-analog controller for converting the digital output signal to an n-bit VCO adjust signal, wherein the n-bit VCO adjust signal comprises an analog voltage coupled to control the initial VCO clock frequency; and a circuit adapted to open the PLL and close the VCO initial frequency calibration circuit to calibrate the initial VCO clock frequency, the circuit being further adapted to close the PLL and open the VCO initial frequency calibration circuit while the n-bit VCO adjust signal maintains the calibrated initial VCO clock frequency to enable the PLL to further adjust the VCO clock frequency from the calibrated initial VCO clock frequency, where the n-bit VCO adjust signal is set to an initial value which may be adjusted while calibrating the initial VCO clock frequency by the VCO initial frequency calibration circuit to enable the CDR circuitry to generate the initial VCO clock frequency within the programmable phase locked loop lock range of the clock rate of the high data rate serial data before closing the PLL and opening the VCO initial frequency calibration circuit, and wherein a phase detection module of the PLL is coupled to receive a phase of the high data rate serial data and a phase of a feedback signal, generated at an output of the PLL to enable the VCO clock frequency to correspond to the frequency of the high data rate serial data after calibrating the initial VCO clock frequency.

2. The transceiver of claim 1 wherein the frequency detection block produces a lock signal, a VCO high signal, and a lock update signal based upon the indication of the difference between the reference clock and the divided VCO clock, and a plurality of user selected inputs.

3. The transceiver of claim 2 wherein the plurality of user selected inputs further includes at least one pre-calibration signal and at least one post-calibration signal, wherein the at least one pre-calibration signal selects a frequency detection lock range and a hysteresis range and wherein the at least one post-calibration signal selects a PLL lock and another hysteresis range.

4. The transceiver of claim 3 wherein the frequency detection block comprises a plurality of counters and corresponding circuits that set the lock signal, the VCO high signal, and the lock update signal is based upon a difference in values of the plurality of counters in relation to the plurality of user selected inputs.

5. The transceiver of claim 1 wherein the frequency calibration block implements a state machine for producing the digital output signal that sets an initial operating frequency of the VCO clock.

6. The transceiver of claim 5 wherein the state machine further adjusts the digital output signal based upon a resulting indication of a difference between the reference clock and the divided VCO clock produced by the frequency detection block.

7. The transceiver of claim 5 wherein the state machine performs a coarse frequency selection then a fine frequency adjustment while the phase locked loop is opened from the VCO.

8. The transceiver of claim 5 wherein the state machine is operable to verify that the fine frequency adjustment is producing a digital output value that places an initial VCO clock frequency into a desired range.

9. A method for processing high data rate serial data, comprising:
receiving the high data rate serial data;
setting an initial frequency of operation of a phase locked loop while the phase locked loop is opened, wherein the initial frequency is set within a programmable phase locked loop lock range of a rate of the high data rate serial data;
closing the phase locked loop;
recovering a clock from the high data rate serial data while the phase locked loop is closed; and
wherein setting the initial frequency of operation further comprises:
setting an initial value of a signal operable to adjust a frequency of a VCO clock;
generating an indication of a difference between a reference clock and a divided VCO clock;
modifying the initial value of the signal operable to adjust the frequency of the VCO clock until the frequency of the VCO clock is within the programmable phase locked loop lock range of the rate of the high data rate serial data based upon the difference between the reference clock and the divided VCO clock;
producing a digital output signal having a magnitude based upon the indication of the difference between the reference clock and the divided VCO clock;
converting the digital output signal to an analog signal, wherein the analog signal is the signal operable to adjust the frequency of the VCO clock to the initial frequency;
maintaining the adjusted frequency of the VCO clock at the initial frequency until the phase locked loop is closed to enable the phase locked loop to further adjust the frequency of the VCO clock from the initial frequency;
comparing a phase of the high data rate serial data and a phase of a feedback signal, generated at an output of the phase locked loop; and
enabling the frequency of the VCO clock to correspond to the frequency of the high data rate serial data based upon the comparison.

10. The method of claim 9 further including producing a lock signal, a VCO high signal, and a lock update signal based upon the indication of the difference between the reference clock and the divided VCO clock, and a plurality of user selected inputs.

11. The method of claim 10 wherein the plurality of user selected inputs further includes at least one pre-calibration signal and at least one post-calibration signal, wherein the at least one pre-calibration signal selects a frequency detection lock range and a hysteresis range and wherein the at least one post-calibration signal selects a PLL loop open calibration lock and another hysteresis range.

12. The method of claim 11 wherein the lock signal, the VCO high signal, and the lock update signal are set based upon a difference in values of a plurality of counters in relation to the plurality of user selected inputs.

13. The method of claim 9 further including adjusting the digital output signal based upon a resulting indication of existence of a difference between the reference clock and the divided VCO clock produced by a frequency detection block.

14. The method of claim 13 further including performing a coarse frequency selection by producing the digital output signal having a first step size and then a fine frequency adjustment producing the digital output signal having a second step size prior to performing phase locked loop calibration wherein the first step size is substantially larger than the second step size.

15. The method of claim 14 wherein the first step size is eight times greater than the second step size.

16. The method of claim 14 further including waiting a specified period after one of the coarse or fine calibration steps before performing a subsequent calibration step.

17. The method of claim 13 further including verifying that the fine frequency adjustment is producing a digital output value that places an initial VCO clock frequency into a desired range.

18. The method of claim 17 wherein the step of verifying includes verifying a plurality of times.

19. The method of claim 18 wherein the plurality of times is equal to at least three.

20. A system for processing high data rate serial data, comprising:
- means for receiving the high data rate serial data;
- means for setting an initial frequency of operation of a phase locked loop while the phase locked loop is opened, wherein the initial frequency is set within a programmable phase locked loop lock range of a rate of the high data rate serial data;
- means for closing the phase locked loop;
- means for recovering a clock from the high data rate serial data while the phase locked loop is closed; and
- wherein setting the initial frequency of operation further comprises:
    - means for setting an initial value of a signal operable to adjust a frequency of a VCO clock;
    - means for generating an indication of a difference between a reference clock and a divided VCO clock;
    - means for modifying the initial value of the signal operable to adjust the frequency of the VCO clock until the frequency of the VCO clock is within the programmable phase locked loop lock range of the rate of the high data rate serial data based upon the difference between the reference clock and the divided VCO clock;
- means for producing a digital output signal having a magnitude based upon the indication of the difference between the reference clock and the divided VCO clock;
- means for converting the digital output signal to an analog signal, wherein the analog signal is the signal operable to adjust a frequency of the VCO clock to the initial frequency; and
- means for maintaining the adjusted frequency of the VCO clock at the initial frequency until the phase locked loop is closed to enable the phase locked loop to further adjust the frequency of the VCO clock from the initial frequency;
- means for comparing a phase of the high data rate serial data and a phase of a feedback signal generated at an output of the phase locked loop; and
- means for enabling the frequency of the VCO clock to correspond to the frequency of the high data rate serial data based upon the comparison.

* * * * *